(12) United States Patent
Sip

(10) Patent No.: US 8,112,060 B2
(45) Date of Patent: Feb. 7, 2012

(54) ELECTRONIC DEVICE WITH DETACHABLE AUDIO MODULE

(75) Inventor: Kim-Yeung Sip, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 379 days.

(21) Appl. No.: 12/494,318

(22) Filed: Jun. 30, 2009

(65) Prior Publication Data

US 2010/0261499 A1    Oct. 14, 2010

(30) Foreign Application Priority Data

Apr. 10, 2009   (CN) .......................... 2009 1 0301480

(51) Int. Cl.
*H04B 1/08* (2006.01)

(52) U.S. Cl. .... 455/347; 455/128; 455/90.3; 455/575.1; 361/796

(58) Field of Classification Search ............... 455/550.1, 455/41.2, 41.1, 575.1–575.6; 379/430, 449; 361/796

See application file for complete search history.

(56) References Cited

U.S. PATENT DOCUMENTS

| 7,120,247 | B1 * | 10/2006 | Wade | 379/430 |
| 7,215,924 | B2 * | 5/2007 | Palermo et al. | 455/41.1 |
| 2002/0061733 | A1 * | 5/2002 | Wang | 455/90 |

* cited by examiner

*Primary Examiner* — Lana N Le
*Assistant Examiner* — Golam Sorowar
(74) *Attorney, Agent, or Firm* — Altis Law Group, Inc.

(57) ABSTRACT

An electronic device includes a main body and an audio module. The main body includes a first circuit board and a first coil. The first circuit board is configured for processing electrical signals. The first coil is electrically connected with the first circuit board, and configured to convert electrical signals with electromagnetic waves. The audio module includes a second circuit, a speaker, a microphone, and a second coil. The second circuit board is configured for processing electrical signals. The speaker is electrically connected with the second circuit board, and produces a sound according to electrical signals. The microphone is electrically connected with the second circuit board and configured to detect sound wave and generate electrical signals. The second coil is electrically connected with the second circuit board, and configured to convert electromagnetic waves with electrical signal.

7 Claims, 4 Drawing Sheets

ELECTRONIC DEVICE WITH DETACHABLE AUDIO MODULE

BACKGROUND

1. Technical Field

The present disclosure relates to electronic devices and, particularly, to an electronic device with a detachable audio module.

2. Description of Related Art

Electronic devices, such as cellular phones, typically include an audio module. The audio module is typically accommodated within the electronic device. If or when the audio module becomes dysfunctional, the electronic device must be discarded or need to be disassembled to replace the audio module. This may be expensive and/or inconvenient.

What is needed, therefore, is an electronic device with a detachable audio module, which can overcome the above-described problem.

DETAILED DESCRIPTION

Embodiments of the present disclosure will now be described in detail below, with reference to the accompanying drawings.

Figure 1:
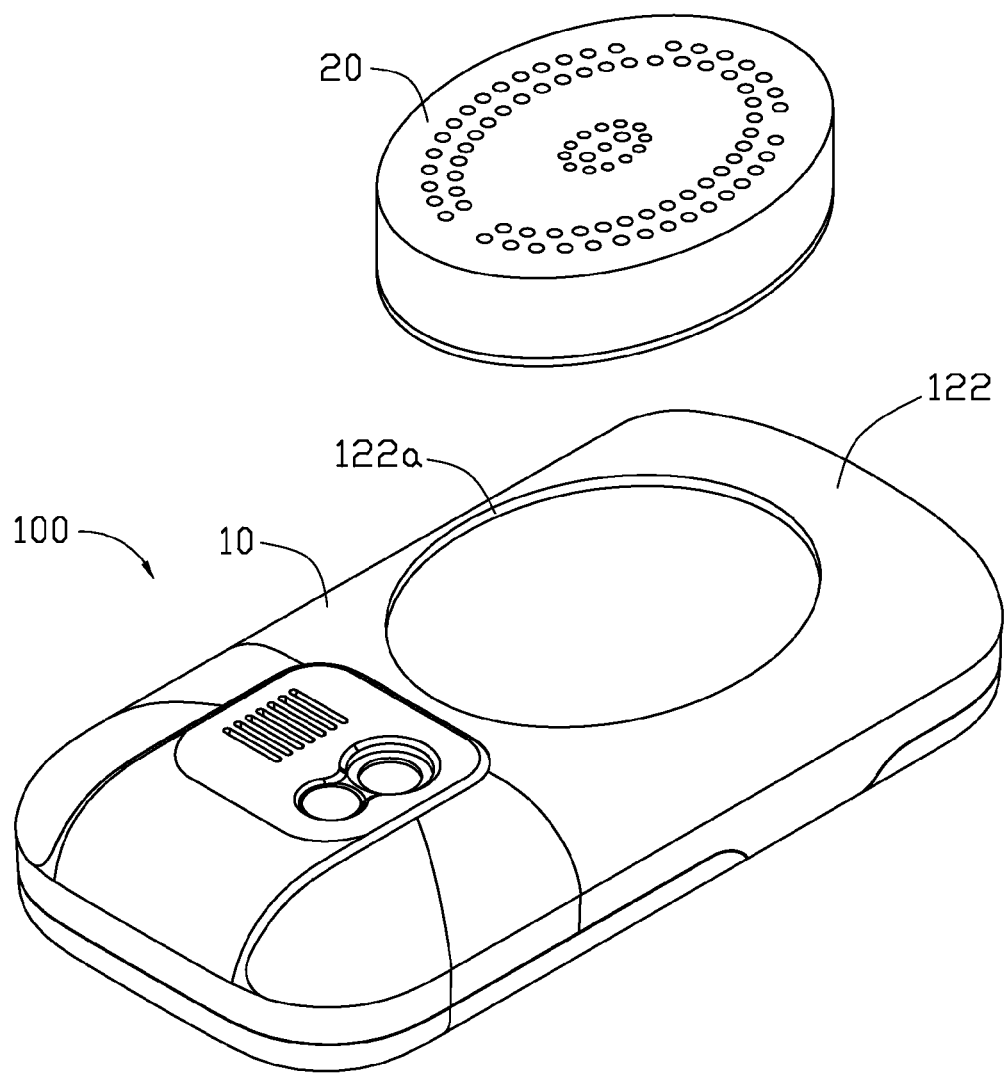
FIG. 1 is an isometric view of an electronic device where an audio module is detached from a main body.
Figure 2:
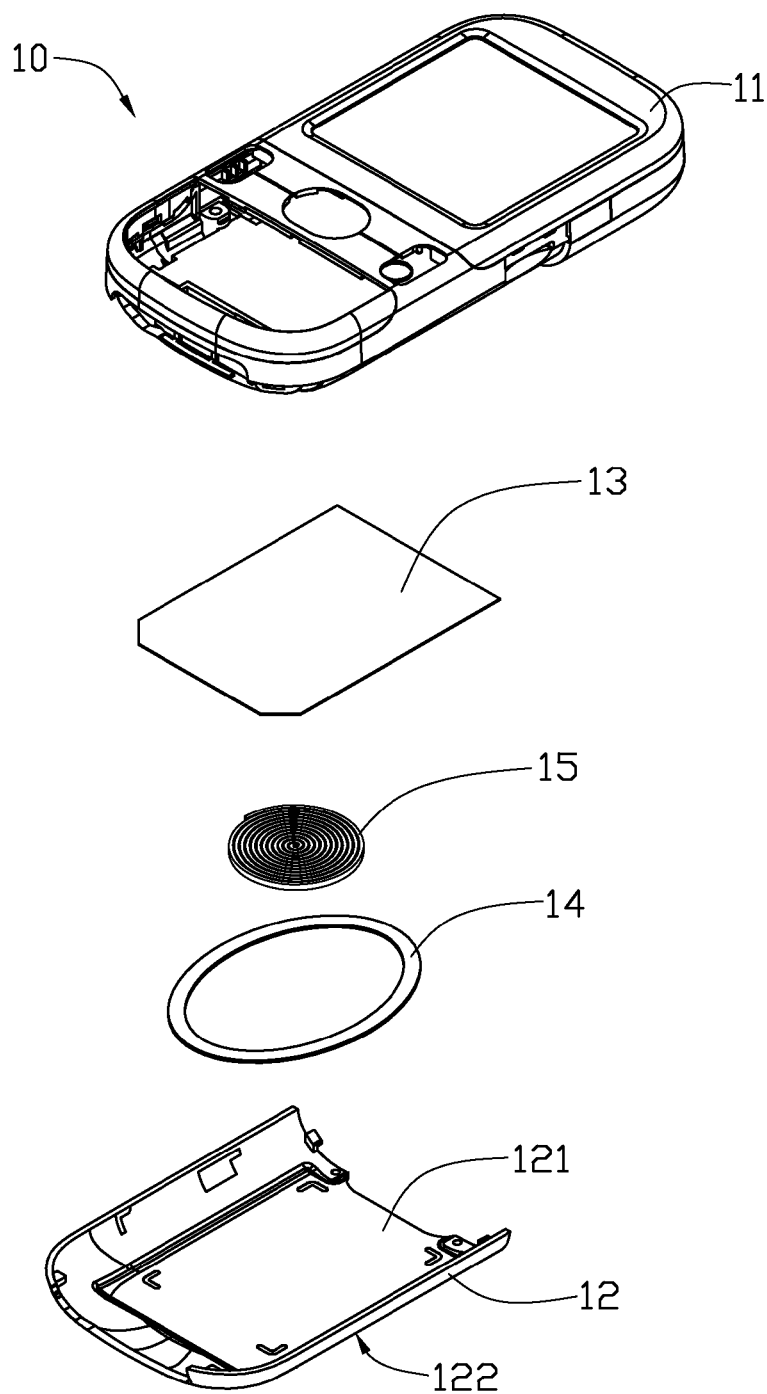
FIG. 2 is an isometric, exploded view of the main body of FIG. 1.

Referring to FIGS. 1-2, an electronic device 100, according to an exemplary embodiment, includes a main body 10 and an audio module 20. In the present embodiment, the electronic device 100 is a cellular phone.

The main body 10 includes a first casing 11, a rear cover 12, a first circuit board 13, a first magnet 14, and a first coil 15.

The first casing 11 is cuboid in shape, and includes various required mechanical and electrical components of the electronic device 100 installed therein. The rear cover 12 is a rectangular plate, and includes an inner surface 121 and an outer surface 122. The rear cover 12 defines an audio module seat 122a in the outer surface 122. The first circuit board 13 is configured for processing electrical signals. The first magnet 14 is ring-shaped. The first coil 15 is configured to transform electrical signals to electromagnetic waves, or transform electromagnetic waves to electrical signals.

In assembly of the main body 10, the magnet 14 is disposed on the inner surface 121. The first coil 15 is also secured to the inner surface 121 and surrounded by the first magnet 14. The first circuit board 13 is fixed to the inner surface 121 and covers the first magnet 14 and the first coil 15. Then, the rear cover 12 covers the first casing 11, forming a closed space. Accordingly, the first circuit board 13, the first magnet 14, and the first coil 15 are accommodated in the closed space. The first coil 15 is electrically connected with the first circuit board 13.

Figure 3:
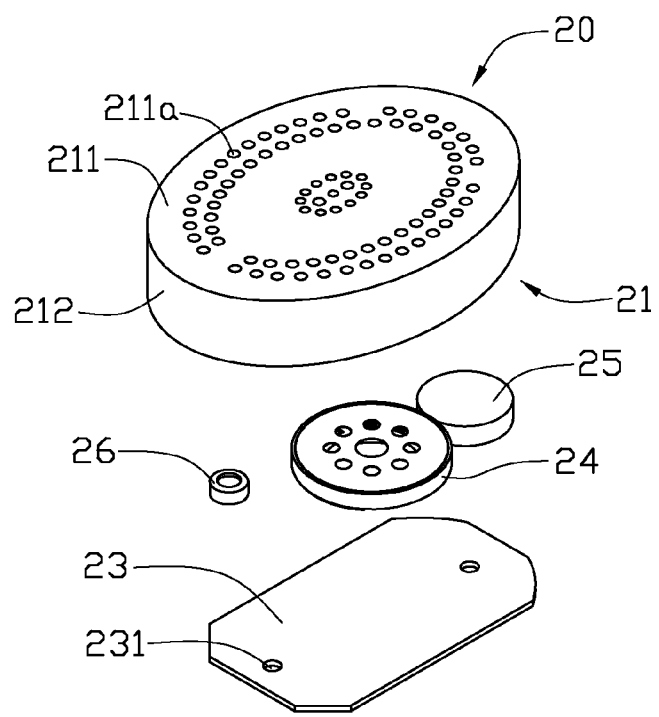
FIG. 3 is an isometric, exploded view of the audio module of FIG. 1.
Figure 3:
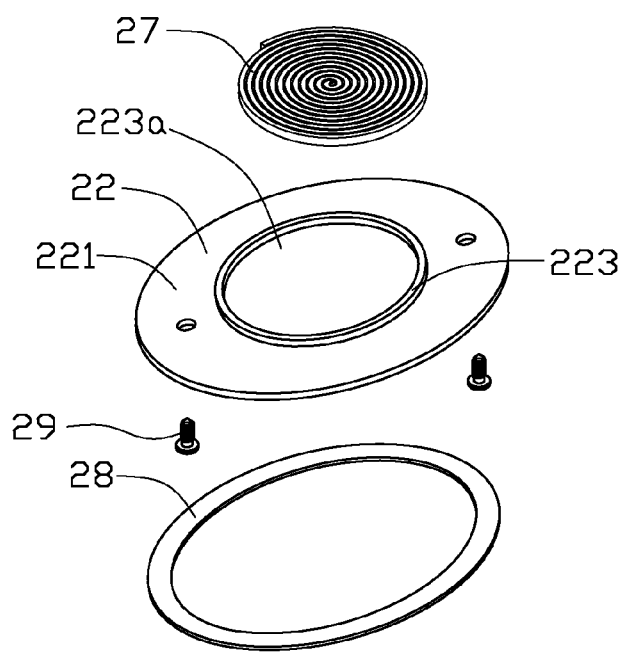
Figure 4:
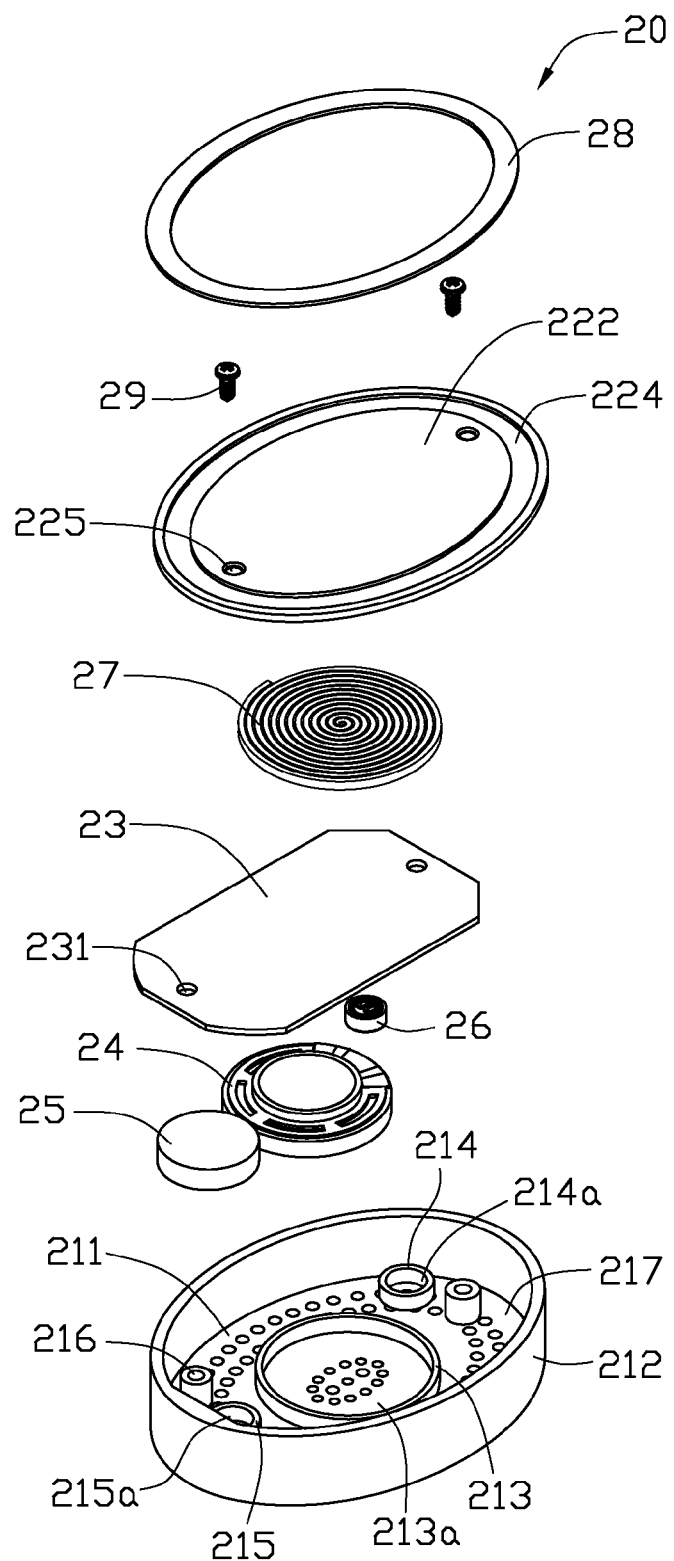
FIG. 4 is an isometric, exploded view of the audio module of FIG. 1, viewed at another angle.

Referring to FIGS. 3-4, the audio module 20 includes a second casing 21, a bottom plate 22, a second circuit board 23, a speaker 24, a microphone 25, a battery 26, a second coil 27, a second magnet 28, and a number of screws 29.

The second casing 21 includes a circular top board 211, a side wall 212, a first receiving ring 213, a second receiving ring 214, a third receiving ring 215, and two screw holders 216.

The circular top board 211 defines a number of through holes 211a. The side wall 212 extends uprightly from an edge of the circular top board 211. The circular top board 211 and the sidewall 212 form a receiving space 217. The first receiving ring 213, the second receiving ring 214, the third receiving ring 215, and the screw holders 216 extend uprightly from the circular top board 211 with in the receiving space 217. The first receiving ring 213 and the top board 211 form a speaker receiving space 213a. The second receiving ring 214 and the top board 211 form a microphone receiving space 214a. The third receiving ring 215 and the top board 211 form a battery receiving space 215a.

The bottom plate 22 is circular and includes a first surface 221 and a second surface 222. The bottom plate 22 includes a fourth receiving ring 223 uprightly extending upwards from the first surface 221, and forms a coil receiving space 223a. The bottom plate 22 also defines a ring-shaped groove 224 in the second surface 222. Both the fourth receiving ring 223 and the ring-shaped groove 224 are substantially concentric with the bottom plate 22. The bottom plate 22 defines two first screw holes 225. The first screw holes 225 are located outside of the fourth receiving ring 223 but inside the ring-shaped groove 224.

The second circuit board 23 is a rectangular plate, and configured for processing electrical signals. The second circuit board 23 defines two second screw holes 231. The second coil 27 is configured to transform electrical signals to electromagnetic waves, or transform electromagnetic waves to electrical signals. The second magnet 28 is ring-shaped.

In assembly of the audio module 20, the speaker 24 is received in the speaker receiving space 213a. The microphone 25 is received in the microphone receiving space 214a. The battery 26 is received in the battery receiving space 215a. The second coil 27 is received in the coil receiving space 223a. The second magnet 28 is received in the ring-shaped groove 224. The second circuit board 23 is received in the receiving space 217. The second circuit board 23 covers and electrically connects with the speaker 24, the microphone 25, and the battery 26. The bottom plate 22 covers the second casing 21. The screws 29 screw into the first screw holes 225, the second screw hole 231, and the screw holders 216. Therefore the bottom plate 22 and the second circuit board 23 are fixed to the second casing 21. The second coil 27 is electrically connected with the second circuit board 23.

In use, the audio module 20 is placed in the audio module seat 122a. The attractive force of the first magnet 14 and the second magnet 28 firmly holds the audio module 20 to the main body 10. The microphone 25 detects and converts sound waves to electrical signals. The electrical signals are sent to the second circuit board 23. The second circuit board 23 processes the electrical signals and sends them to the second coil 27. The second coil 27 generates electromagnetic waves corresponding to the electrical signals. A current is induced in the first coil 15 correspondingly to the electromagnetic waves. The first circuit board 13 processes the induced current and convert it to electrical signals. The electrical components of the first casing 11 send out radio-frequency signals corresponding to the electrical signals sent from the first circuit board 13.

When radio-frequency signals are received by the electrical components of the first casing 11, the radio-frequency signals are converted to electrical signals and sent to the first circuit board 13. The first circuit board 13 processes the electrical signals and sends them to the first coil 15. The first coil 15 generates electromagnetic waves corresponding to the electrical signals. A current is induced in the second coil 27 correspondingly to the electromagnetic waves. The second circuit board 23 processes the induced current and convert it to electrical signals. The speaker 24 produces a sound corresponding to the electrical signals sent from the second circuit board 23.

Further, when the electronic device 100 is being recharging, the battery 26 (FIG. 3) of the audio module 20 is also recharged. The charging current is applied to the first coil 15. A current is induced in the second coil 27 and used to charge battery 26. The battery 26 is electrically connected with the speaker 24 and the microphone 25.

When the audio module 20 becomes dysfunctional, a user can easily detach and replace the audio module 20 from the main body 10, which is inexpensive and convenient.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An electronic device, comprising:
   a main body comprising:
   a first circuit board configured for processing electrical signals; and
   a first coil electrically connected with the first circuit board, and configured to transform electrical signals with electromagnetic waves;
   an audio module comprising:
   a second circuit board configured for processing electrical signals;
   a speaker electrically connected with the second circuit board, and produces a sound wave according to electrical signals;
   a microphone electrically connected with the second circuit board, and configured to detect sound wave and generate electrical signals;
   a second coil electrically connected with the second circuit board, and configured to transform electromagnetic waves with electrical signals; and
   a second casing comprising:
   a circular top board;
   a side wall uprightly extending from an edge of the circular top board and forming a receiving space with the circular top board;
   a first receiving ring uprightly extending from the circular top board within the receiving space and forming a speaker receiving space; and
   a second receiving ring uprightly extending from the circular top board within the receiving space and forming a microphone receiving space.

2. The electronic device of claim 1, wherein the main body further comprises a first magnet, the audio module further comprises a second magnet, the audio module is fixed to the main body by the magnetic attractive force of the first magnet and the second magnet.

3. The electronic device of claim 2, wherein the main body further comprises a first casing and a rear cover, the first casing and the rear cover form a closed space, the first circuit board, the first magnet, and the first coil are accommodated in the closed space.

4. The electronic device of claim 3, wherein the first magnet is disposed on the rear cover, the first coil is also secured on the rear cover, and is surrounded by the first magnet.

5. The electronic device of claim 1, wherein the speaker is received in the speaker receiving space, the microphone is received in the microphone receiving space.

6. The electronic device of claim 1, wherein the audio module further comprises a bottom plate including a first surface and a second surface, the first surface forms a coil receiving space, the second surface defines a ring-shaped groove, the second coil is received in the coil receiving space, the second magnet is received in the ring-shaped groove.

7. The electronic device of claim 1, wherein the audio module further comprises a battery, the battery is electrically connected with the speaker and the microphone.

* * * * *